Feb. 14, 1967 L. A. BARNES, JR., ETAL 3,304,509
LINEAR FULL WAVE DETECTOR
Filed March 10, 1964
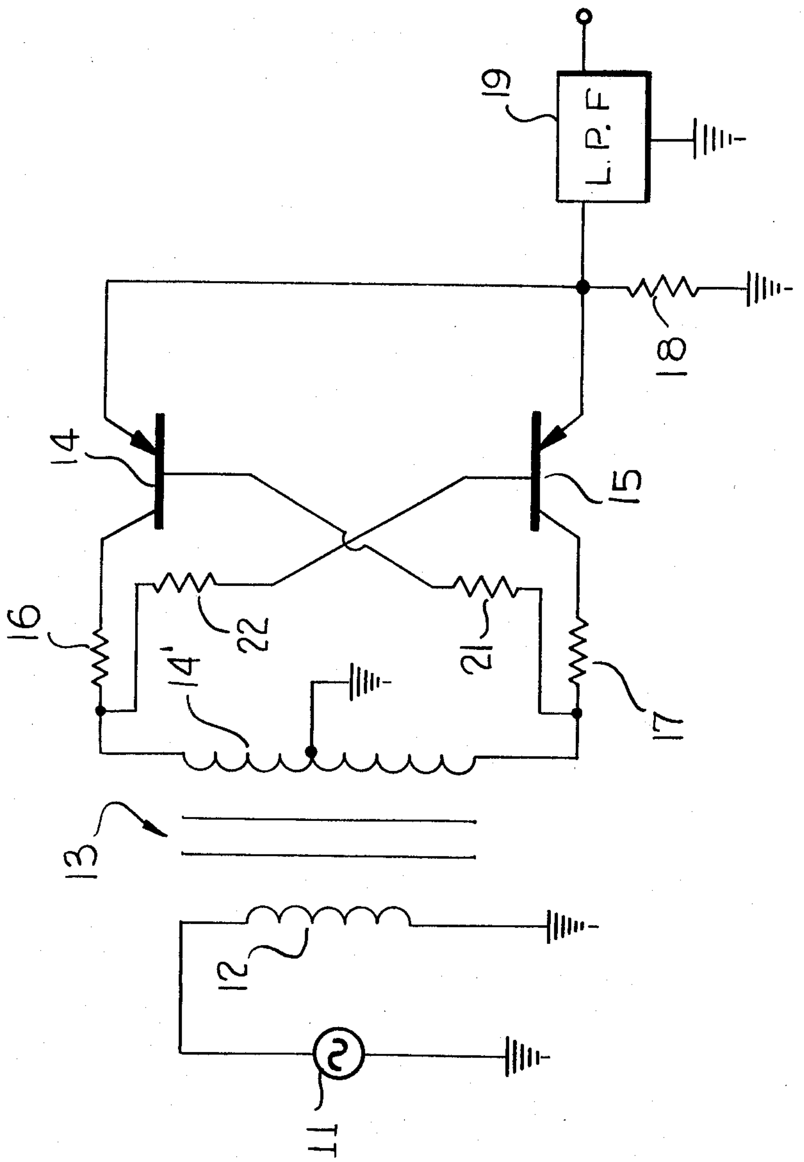
INVENTORS
LAURENCE A. BARNES, Jr.
& RONALD E. IRONS
BY Hurvitz & Rose
ATTORNEYS 3,304,509
LINEAR FULL WAVE DETECTOR
Laurence A. Barnes, Jr., Springfield, and Ronald E. Irons, Burke, Va., assignors to Melpar, Inc., Falls Church, Va., a corporation of Delaware
Filed Mar. 10, 1964, Ser. No. 350,812
6 Claims. (Cl. 329—101)

The present invention relates generally to full wave detection for alternating signal sources and more particularly to a detector employing a pair of push-pull transistors, each of which is gated on by the source to pass alternate half cycles of the source.

For many applications, e.g. speech analysis, telemetry, analog computer circuitry and analog to digital converters, it is necessary that an alternating signal source of large dynamic range (100:1 or 40 db) be rectified into a variable amplitude direct signal. The direct signal must be directly proportional to the peak value of the alternating current over the entire range of interest, i.e. the alternating current to direct current conversion must be ultra linear.

In the past, a typical approach to the problem involved the use of a conventional full wave diode rectifier having substantially the same circuit configuration as a power converter. The diode rectifier is not capable of achieving wide range, linear conversion because it has a square law current versus voltage response over a substantial portion of its characteristic. Another disadvantage attendant with the utilization of diodes resides in their substantial saturation impedances which are reached only after the square law variation voltage is exceeded. The diode saturation impedance is too great to permit faithful reproduction of the passed waveform over a large dynamic range of input signals.

Another approach to the problem of linear conversion over a large dynamic range has been to employ a pair of transistors that are alternately gated on by square wave sources in synchronism with the applied alternating signal source. While circuits of this nature have functioned admirably to produce the desired result, they are usually complex, difficult to design and relatively expensive.

According to the present invention, these difficulties in the prior art are overcome by a simple circuit employing a pair of like conductivity type push-pull transistors. The transistor collectors are responsive to out of phase replicas of the alternating input signal. The transistors are alternately rendered conductive and nonconductive by the application of the replicas to their bases, in a manner whereby the replica applied to one collector is applied to the other base and vice versa. In response to the base-collector voltage across each transistor during alternate half cycles of the source, the transistors are sequentially driven into saturation whereby the voltages at their collectors are coupled through their emitters to a common load resistor.

By including a properly proportioned resistor in the base circuit of each transistor, the present invention provides ultra linear conversion of alternating signal to direct signal over the very wide dynamic range of 40 db. The impedance of the base resistors must be great enough to prevent substantial loading of the alternating signal source. They also must not be too great, otherwise noise is introduced and transistor base collector saturation is not attained over the entire dynamic range of the input signal. It has been found that these requirements are met with resistors in the 5,000 to 25,000 ohm range, and that an optimum resistance value is approximately 10,000 ohms.

It is accordingly an object of the present invention to provide a new and improved full wave detector capable of ultra linear conversion of alternating signals to direct signals over a large dynamic range.

Another object of the present invention is to provide a new and improved linear transistor detector that does not require external shaping circuits for triggering the transistor into conduction, and wherein the rectified and triggering waveforms are substantially the same.

It is another object of the present invention to provide a new and improved full wave detector employing switching devices with saturation impedances considerably lower than diodes so that the detector can linearly convert alternating signals into direct signals over a very wide dynamic range.

Still another object of the invention is to provide a new and improved inexpensive, simple, easy to design, linear, full wave transistor detector capable of handling signals over a wide dynamic range.

The above and still further objects, features and advantages of the present invention will become apparent upon consideration of the following detailed description one specific embodiment thereof, especially when taken in conjunction with the accompanying drawing, wherein:

The single figure is a circuit diagram of a preferred embodiment of the invention.

Reference is now made to the figure, wherein an alternating signal source 11, capable of very large peak to peak voltage variations, over a 40 db or 100:1 range, is applied to the primary winding 12 of transformer 13. The turns ratio between primary 12 and tapped secondary 14' is such that a 50-volt peak-to-peak voltage is generated between the grounded center tap and one end of winding 14' for the largest amplitude swing applied to winding 12.

The collectors of matched, push pull PNP transistors 14, 15 are connected through current limiting resistors 16, 17 to opposite ends of winding 14' while the transistor emitters are connected together to grounded load resistor 18. The voltage developed across load resistor 18 is coupled to low pass filter 19 that smoothes out the ripple in the waveform generated across the load connected to the output terminals of filter 19.

Switching of transistors 14 and 15 is accomplished by connecting their bases through resistors 21 and 22 to opposite ends of winding 14'. This connection enables sufficient negative current to be applied to the base-collector junction of each transistor to saturate the emitter-collector path on alternate half cycles of source 11. On the opposite half cycles, the formerly saturated transistor is cut off.

To describe the circuit operation, first assume that alternating signal source 11 is in a half cycle whereby a positive voltage is developed between the transformer tap and resistor 16 while a negative voltage exists between the tap and resistor 17. The positive current applied to the base of transistor 15 via resistor 22 cuts off that transistor so the negative voltage at its collector is not coupled to load resistor 18. At the same time, negative current flows through resistor 21 to the base-collector junction of transistor 14. This negative current is of sufficient value to trigger transistor 14 into saturation for almost the entire half cycle under consideration. With transistor 14 in saturation, its collector emitter impedance is very low, on the order of 1 to 2 ohms for the 2N398B transistors employed. Thereby, the positive voltage applied to the collector of transistor 14 is passed virtually unaltered to its emitter and load resistor 18.

On the following half cycle of source 11, the states of transistors 14 and 15 are reversed so that transistor 15 conducts while transistor 14 is cut off. The current deriving from the emitter of transistor 15 is summed with the substantially zero current now flowing through transistor 14 and the resultant is applied to load 18. It is thus seen that the waveform developed across resistor 18 is a full wave rectification of alternating signal source 11.

Effective saturation of one of transistors 14 and 15 by the currents supplied to their bases occurs for most of each half cycle throughout the 40 db range of voltages across secondary 14. Thereby, a linear relationship exists between the peak voltages across winding 14′ and load 18 over the range of secondary voltages between 0.5 and 50 volts, peak to peak. Since low pass filter 19 responds to the peak voltages across load 18, there is a corresponding linear relationship between alternating signal source 11 and the filter output over the entire 40 db range of input amplitude variations.

To insure proper switching of transistors 14 and 15, we have found that resistors 21 and 22 each should have a value between 5,000 ohms and 25,000 ohms, and that an optimum value of each is approximately 10,000 ohms. If the resistors are less than the specified minimum, proper transistor operation during alternate half cycles of source 11 is not attained. That this undesirable result occurs may be seen by assuming that a positive voltage subsists between the center tap and resistor 17 and that resistors 21 and 22 both are of zero value. Under these conditions, considerable positive current flows between the collector and base of transistor 15 to the upper end of winding 14′. This low impedance path loads transformer 13 extensively so that a linear relationship between the voltages of source 11 and across resistor 18 cannot exist over a large dynamic range. As the value of resistor 22 increases to about 5,000 ohms, the loading effects of the path between the base of transistor 15 and the upper end of winding 14′ are diminished to the point where substantially all of the positive current from the lower end of winding 14′ is fed to load resistor 18 and virtually no current flows through resistor 16. Regarding the maximum upper value of 25K ohms for resistors 21 and 22, this value is selected because a higher base resistance (1) causes noise in the conducting transistor so that linearity is impossible and (2) substantially attenuates the base current for low input voltages so that transistor saturation, hence linearity, cannot be achieved over a 40 db range.

Another factor to consider in the circuit design is the value of resistors 16 and 17. These resistors, which typically have a value of 150 ohms each, are included in the circuit to prevent "current hogging" by one transistor at high temperatures. They limit the base-collector current so that a saturated, fully conducting transistor can be cut off immediately upon the cessation of a negative current to its base. For low and medium temperature applications, resistors 16 and 17 are not necessary because the transistor emitter-collector impedances are large enough to insure that the transistors can be driven out of saturation.

While the circuit has been described and illustrated in conjunction with positive rectification it is to be understood that negative, full wave rectified currents can be derived if NPN, rather than PNP transistors are employed.

In testing the circuit of the present invention, we have found that linear conversion of alternating signal to direct signal occurs throughout a 40 db range of input signals. This extreme linearity is achieved because of the low emitter-collector saturation impedance for a substantial portion of alternate half cycles of the applied alternating signal. Also, the problem of square law variation that exists with diodes prior to saturation, is nonexistent with transistors, devices that virtually jump into sauration in response to the proper polarity current flowing in their base-collector junctions.

While we have described and illustrated one specific embodiment of our invention, it will be clear that variations of the details of construction which are specifically illustrated and described may be resorted to without departing from the true spirit and scope of the invention as defined in the appended claims.

We claim:

1. A linear full wave detector comprising, in combination, a pair of substantially identical parallel circuit paths, a common load impedance connected in series with said parallel circuit paths, alternating signal generating means connecting said circuit paths for simultaneous application of identical signals of opposite phase to each, each of said circuit paths including a normally non-conductive transistor of the same conductivity type as the transistor in the other of said paths, each transistor providing a conductive connection through its respective circuit path from said signal generating means to said common load impedance when triggered to a conductive state, and means for respectively applying driving current derived from the signal applied to each of said paths to the transistor in the other of said paths to alternately trigger said transistors to a conductive state in accordance with the instantaneous polarity of said alternating signal.

2. The combination according to claim 1 wherein said signal generating means connecting said circuit paths comprises a transformer having an input winding, an output winding, said output winding having a center tap connected to a common reference potential, and means for applying alternating signal to said input winding.

3. The combination according to claim 2 wherein opposite ends of said output winding are coupled to the emitter-collector paths of the respective transistors in said parallel circuit paths, said common load impedance is coupled to the emitter-collector paths of the transistors in both said circuit paths, and said driving current applying means applies signal from each circuit path to the base of the transistor in the other circuit path, said transistors being triggered in alternation to the conductive state during successive half cycles of a full cycle of said A.C. signal.

4. The combination according to claim 3 wherein said cross coupling means constitutes a pair of resistors each respectively connected from a different end of said ouput winding to the base of the transistor in the other circuit path.

5. The combination according to claim 3 wherein is included a resistor in each circuit path, between an end of said output winding and the respective transistor in that circuit path.

6. The combination according to claim 3 further including filter means coupled to said load impedance for smoothing the waveform passing therethrough as a result of said alternation in conductivity between said transistors.

References Cited by the Examiner

UNITED STATES PATENTS

| | | | |
|---|---|---|---|
| 2,847,566 | 8/1958 | Metzger | 329—137 X |
| 3,015,780 | 1/1962 | Schayes et al. | 330—15 X |
| 3,033,995 | 5/1962 | Putzrath | 307—88.5 |
| 3,037,113 | 5/1962 | Bier | 329—101 X |
| 3,129,391 | 4/1964 | Kabell | 332—16 |
| 3,159,802 | 12/1964 | Dome | 332—43 X |
| 3,202,940 | 8/1965 | Dietrich | 332—43 |
| 3,243,707 | 3/1966 | Cottrell | 331—113 X |

ROY LAKE, *Primary Examiner.*

A. L. BRODY, N. KAUFMAN, *Assistant Examiners.*